US006211568B1

United States Patent
Hong (10) Patent No.: US 6,211,568 B1
(45) Date of Patent: *Apr. 3, 2001

(54) ELECTROMIGRATION RESISTANT METALLIZATION STRUCTURES AND PROCESS FOR MICROCIRCUIT INTERCONNECTIONS WITH RF-REACTIVELY SPUTTERED TITANIUM TUNGSTEN AND GOLD

(75) Inventor: Sam-Hyo Hong, Spanga (SE)

(73) Assignee: Telefonaktiebolaget LM Ericsson(publ), Stockholm (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,025

(22) Filed: Jun. 9, 1998

Related U.S. Application Data (62) Division of application No. 08/590,607, filed on Jan. 24, 1996, now Pat. No. 5,821,620, which is a continuation of application No. 08/198,354, filed on Feb. 18, 1994, now abandoned.

(51) Int. Cl.[7] .......................... H01L 23/48; H01L 23/52; H01L 29/40

(52) U.S. Cl. .................. 257/754; 257/750; 257/751; 257/753; 257/764

(58) Field of Search ................... 257/750–751, 257/758, 763–765, 621

(56) References Cited

U.S. PATENT DOCUMENTS

| | | | |
|---|---|---|---|
| 3,833,842 | 9/1974 | Cunningham et al. | 317/234 R |
| 4,135,295 | 1/1979 | Price | 29/623 |
| 4,141,022 | 2/1979 | Sigg et al. | 357/23 |
| 4,300,149 | 11/1981 | Howard et al. | |
| 4,330,343 | 5/1982 | Christou et al. | 148/1.5 |
| 4,354,307 | 10/1982 | Vinson et al. | 437/201 |
| 4,507,851 | 4/1985 | Joyner et al. | 29/590 |
| 4,566,026 | 1/1986 | Lee et al. | 357/71 |
| 4,702,967 | 10/1987 | Black et al. | 428/620 |
| 4,753,851 | 6/1988 | Roberts et al. | 428/267 |
| 4,787,958 | 11/1988 | Lytle | 156/652 |

(List continued on next page.)

FOREIGN PATENT DOCUMENTS

| | | | |
|---|---|---|---|
| 4129647 | 4/1992 | (DE) | 257/915 |
| 0 024 572 | 7/1980 | (EP). | |
| 0 262 575 | 9/1987 | (EP). | |
| 62-0120037 | 6/1987 | (JP) | 257/784 |

OTHER PUBLICATIONS

D.C. Dening et al., "Reliability of High Temperature I$^2$L Integrated Circuits," *IEEE/IRPS*, 1984, pp. 30–36.

R.S. Nowicki et al., "Studies of the Ti–W/Au Metallization on Aluminum," *Thin Solid Films*, 53 (1978), pp. 195–205. (Paper presented at the International Conference on Metallurgical Coatings, San Francisco, California, U.S.A., Apr. 3–7, 1978.).

J.A. Cunningham et al., "Corrosion Resistance of Several Integrated–Circuit Metallization , Systems," *IEEE Transactions on Reliability*, vol. R–19, No. 4, Nov. 1970, pp. 182–187.

*Primary Examiner*—Steven Loke
*Assistant Examiner*—Cuong Quang Nguyen
(74) *Attorney, Agent, or Firm*—Burns, Doane, Swecker & Mathis, L.L.P.

(57) ABSTRACT

Two metallization schemes of PtSi/TiW/TiW(N)/Au (Type I) and PtSi/TiW/TiW(N)/TiW/Au (Type II) and associated process are described for microcircuit interconnections. The metallization schemes and process are capable of IC-interconnections with a metal-pitch as small as 1.5 μm, or even smaller. The metallization schemes are reliable for continuous high temperature and high current operations.

24 Claims, 8 Drawing Sheets

U.S. PATENT DOCUMENTS

| | | | |
|---|---|---|---|
| 4,845,050 | 7/1989 | Kim et al. | 437/192 |
| 4,880,708 | 11/1989 | Sharma et al. | 428/620 |
| 4,907,066 * | 3/1990 | Thomas et al. | 257/763 |
| 4,927,505 | 5/1990 | Sharma et al. | 204/34.5 |
| 4,965,218 | 10/1990 | Geissberger et al. | 437/41 |
| 4,985,750 | 1/1991 | Hoshino | 257/751 |
| 5,041,191 | 8/1991 | Watson | 156/652 |
| 5,049,975 | 9/1991 | Ajika et al. | 257/763 |
| 5,055,908 | 10/1991 | Fuller et al. | 357/764 |
| 5,136,364 | 8/1992 | Byrne | 257/764 |
| 5,164,331 | 11/1992 | Lin et al. | 437/192 |
| 5,173,449 | 12/1992 | Lorenzen et al. | 437/192 |
| 5,249,728 | 10/1993 | Lam | 437/194 |
| 5,286,676 | 2/1994 | Kruger et al. | 437/190 |
| 5,317,187 | 5/1994 | Hindman et al. | 257/763 |
| 5,343,071 * | 8/1994 | Kazior et al. | 257/621 |
| 5,378,926 | 1/1995 | Chi et al. | 257/767 |
| 5,416,359 | 5/1995 | Oda | 257/751 |
| 5,821,620 * | 10/1998 | Hong | 257/751 |

\* cited by examiner

ELECTROMIGRATION RESISTANT METALLIZATION STRUCTURES AND PROCESS FOR MICROCIRCUIT INTERCONNECTIONS WITH RF-REACTIVELY SPUTTERED TITANIUM TUNGSTEN AND GOLD

This application is a divisional of application Ser. No. 08/590,607, filed Jan. 24, 1996, now U.S. Pat. No. 5,821,620, which is a continuation of application Ser. No. 08/198,354, filed Feb. 18, 1994, now abandoned.

BACKGROUND OF THE INVENTION

1) Field of the Invention

The present invention relates, in general, to metallization schemes for microcircuit interconnections of electronic devices and, more particularly, to PtSi/TiW/TiW(N)/Au (Type I) and PtSi/TiW/TiW(N)/TiW/Au (Type II) gold interconnections of semiconductor devices and associated processes of metallization.

2) Discussion of Related Art

In general, high performance and a higher degree of integration of semiconductor devices require reduction of overall dimensions, including the dimensions of metal leaders and contact hole diameters (including via diameters). This reduction in dimensions causes increases in chip operating temperatures and current densities in the metal stripes and interfaces between silicon and the metal conductors in the contact holes.

At the same time, a decrease in contact hole diameter consequently increases its aspect ratio (i.e., step height/diameter), and hence worsens the step coverage of the metals. A smaller step coverage in the contact holes causes further increases of the current density in the contact holes.

High power transistors, in particular, generate large currents and develop heat. The high current density and high temperature operations of the devices result in rather fast degradation of an aluminum alloy (commonly including copper and silicon) based interconnections due to an electromigration effect. The electromigration, caused by momentum transfer of electrons, causes formation of voids and an interruption in the metal conductors.

Gold is a good conductor and is more than seven times larger in atomic weight than aluminum. Gold based interconnections are very resistant to the electromigration effect. However, because of the Au-Si eutectic (~370° C.), diffusion barriers are needed which should possess some essential properties, such as:

long-term high temperature stability,
good electromigration resistance with a high current density, good adhesion to both insulating films and gold conductor,
a good conductor,
low contact resistance to doped (n+ and p+) silicon, good step coverage in contact holes, non-particulation, and
a wide process latitude even for small dimensions (~1 µm).

Gold based interconnections can usually be formed in two ways. First, a lift-off technique based on evaporation of diffusion barriers and gold can be used, e.g., a lift-off of Ti/Pt/Au metals. Second, a sputtering technique combined with plasma etched gold or electroplated gold conductors can be used.

One of the major advantages of the lift-off technique is that it rather easy to form metal pitches below 2 µm. A successful lift-off technique requires an electron-beam evaporator with a large distance between metal sources and wafers. For instance, for 6" diameter wafers the distance must be larger than 145 cm in order to obtain an incident angle deviation of the evaporated metals less than 3 degrees from the normal to the wafer surface. Consequently, the size of the evaporator will be huge and the waste of precious metals will be very large. Furthermore, a requirement on the photoresist profile is quite high: a thick (>2.5 µm) and reentrant profile having negatively sloped sidewalls (>90°) as shown in FIG. 1c. The technique yields very low step coverage and consistently proves very sensitive to particles with respect to the reliability of the diffusion barriers.

The sputtering and electroplating techniques combined with plasma etching is easily feasible with common equipment and have no difficulty with a large wafer diameter (>6") in contrast to a lift-off technique. However, a drawback with this technique is the difficulty in shrinking a metal-pitch below 4 µm due to some serious process barriers, such as:

photoresist loss in an electroplating bath,
geometry dependence of plating speed and difficulty in plating fine lines together with large size geometry,
too rough Au-conductor surfaces after a wet-etch of the sputtered Au-film used for electroplating and protection of diffusion barriers, and
etch undercuts at the diffusion barriers.

Even by a plasma etch technique it is difficult to eliminate some undercuts because the plated gold layer must act as an etch mask instead of a photoresist.

Gold is much softer than diffusion barriers, and hence it is difficult to apply a strong physical sputtering effect in a plasma etch process. At the same time the gold etch mask can not offer any side passivation with organic polymers like a photoresist etch mask. Therefore it is very important to suppress the etch undercut for the microcircuit interconnections.

In the past titanium-tungsten or/and nitrided titanium-tungsten, herein denoted as TiW and TiW(N) (which do not stand for a stoichiometric composition but for a "pseudo-alloy" of $Ti_xW_{1-x}$ obtained from a cathode composition of X=0.30 (corresponding to Ti=10 wt %)), have been utilized. The actual composition of the sputtered TiW— and TiW(N)—films varies by sputtering parameters, and accordingly varies the film properties as a diffusion barrier and adhesion layers, etc.

Previously, the diffusion barriers of TiW and TiW(N) have been used in the metallization systems of Si/TiW/Al or PtSi/TiW/Al as IC—interconnections or Al(bondpad)/TiW(N)-TiW/Au (wire or bump) for packages.

J. A. Cunningham et al., "Corrosion Resistance of Several Integrated-Circuit Metallization Systems," *IEEE Transactions on Reliability*, Vol. R-19, No. 4, November 1970, pp.182–187, discusses a metallization system of Al(bondpad)/TiW/Au, and R. S. Nowicki et al., "Studies of the TiW/Au metallization on Aluminum," *Thin Solid Films*, 53 (1978), pp. 195–205, discusses a metallization system of Al(bondpad)/TiW(N)/Au. The Nowicki et al. article includes observations about extensive intermixing of TiW and Au at 300° C. for 6 minutes when the TiW-film was relatively pure. They also observed that a reactively sputtered film of TiW(N,O) improved the diffusion barrier property by orders of magnitude. Nitrogen and oxygen contents in the TiW(N,O)-film was ~42 and ~8 at. % (atomic percent), respectively. The oxygen atoms in the TiW(N,O)-film were unintentionally involved from residual gases in the sputter chamber. The TiW(N,O)-film even had minimal intrinsic stress, otherwise a TiW(O)-film with O ~4 at. % had tensile stress.

Two patents to R. K. Sharma et al. disclose the use of a double-layer diffusion barrier of TiW(N)/TiW in a metallization system of Al(bondpad)/TiW(N)(1.5 –3.0 kÅ)/TiW (0.5–1.0 kÅ)/Au(2–7 kÅ) for TAB (tape automated bonding) or wire bonding applications. See U.S. Pat. Nos. 4,880,708 and 4,927,505 dated Nov. 14, 1989 and May 22, 1990, respectively. Preferable thickness intervals are given in the parentheses. The TiW(N) film was obtained by sputtering with a gas mixture consisting of at least 30 vol % $N_2$ in Ar. There is no information about the sputter technique.

The major reason to include Ti into W is to improve the adhesion property to $SiO_2$-layer because strong Ti-O bonds could be expected at the interface. The maximum solubility of Ti into W is only about 10 at. % at 600° C. Any excess Ti will be microscopically distributed in a "pseudo-alloy" of TiW, and even located at grain boundaries and surfaces. The substantial improvement of the diffusion barrier property could be achieved by oxidation or/and nitridation of the Ti-atoms during sputtering of TiW-cathode (target). The formation of stable $TiO_2$ and TiN at grain boundary particularly seems to effectively slow down important grain boundary diffusion. However, one of major drawbacks of the oxidation and nitridation of the Ti-atoms is the loss or reduction in the ability of forming Ti-O bonds at the interface between $SiO_2$ and TiW.

For the package applications, Cunningham et al. and Nowicki et al. have been successful in using TiW(N) directly on top of Al—bondpads because of good adhesion between Al and W which can form intermetallic alloys with each other. Furthermore, one could easily apply strong sputter etch on the Al—surface in order to eliminate $Al_2O_3$ and on the passivation film. The strong sputter etch could roughen the surfaces, and hence could enhance adhesion. In any way, some lateral dimension losses of a few micrometers in an etch due to weak adhesion between TiW(N) and the passivation film of $SiO_2$ (PSG, BPSG glasses) or $Si_3N_4$ can not influence reliability because usually the diffusion barrier covers nearly 10 $\mu$m over the passivation film.

However, the situation is quite different in the microcircuit interconnections where a metal-pitch can be as small as 1.5 $\mu$m. The adhesion strength between a $SiO_2$—layer with contact holes (<1 $\mu$m) and a diffusion barrier has a decisive influence on the size of the etch undercut and reliability. In this case the coverage of the diffusion barrier over the contact hole edge (FIG. 1e) may be a few tenths of a micron where one-tenth micron is very important. The application of a sputter etch is very limited due to very shallow depths of junctions for HF (high frequency) power transistors and high speed devices in general.

Dening et al., "Reliability of High Temperature $I^2L$ Integrated Circuits," *IEEE/International Reliability Physics Symposium Proc.*, 1984, pp.30–36, discusses a metallization system of PtSi/TiW(250 Å)/TiW(N)(2 kÅ)/TiW(250 Å)/Au(5 kÅ)/TiW(500 Å) for IC-interconnection. The article mentions a lift-off technique applied to 3" wafers. There are no details about the lift-off technique in the paper. However, there are some serious feasibility problems in IC-production.

According to the present inventor's experience as well as that reported in the Dening et al. article, the adhesion strength between $SiO_2$ and TiW(N) was not sufficiently strong to withstand the stress caused by thermal mismatching because the deposition temperature of TiW(N) may be in a range of 100–350° C. and a difference of TCE (thermal coefficient of expansion) can be 4–8 ppm/° C. This weak adhesion caused unacceptably large etch undercuts and oftentimes left a small cavity at a sidewall of the contact holes. The formation of the cavity seriously caused reliability problem because Au-diffusion into the bulk-Si as well as Si-diffusion into the Au-layer was observed after annealing at 420° C. for 30 min. The mechanism seems to be surface diffusion.

K. A. Lorenzen et al., in U.S. Pat. No. 5,173,449 dated Dec.22, 1992 entitled "Metallization Process", disclose a metallization process for a scheme of TiW(0.2–0.8 kÅ)/TiW (N)(2–5 kÅ)/TiW(0.2–0.8 kÅ)/Au(5–20 kÅ)/TiW(1–4 kÅ, as an etch mask for Au-patterning and being etched away later) for applications of microdevice interconnections. Major process steps are based on sputtering and plasma etching techniques. However, the process latitude (feasibility) for patterning the fine line Au-conductors (1–1.25 $\mu$m width or less) seems to be low because the plasma etching of a thick Au-layer is based on pure physical sputtering by argon and oxygen gases. Consequently, an $HNO_3$-boil is recommended after the Au-etch in order to clean the etch residues of Au, Ti and W-metals. However, the nitric acid boil can easily attack the TiW-layer unless the TiW-surface had already been oxidized.

The oxidation of the TiW-surface at the same time causes an oxidation of the etch residues of Ti- and W-metals from the eroded etch mask. Consequently, the cleaning procedure is ineffective and risky. The oxidation step can potentially cause an adhesion failure between the Au- and TiW-layers, especially with fine line Au-conductors.

Lorenzen et al. in U.S. Pat. No. 5,173,449 describe in detail the parameter settings of a sputter system (MRC-603, Material Research Corp., N.Y.), especially about $N_2$-gas purge procedure after a reactive sputtering of the TiW(N)-film. However, there is no description about the applied sputter technique which is of decisive importance for the reactive sputtering of the TiW(N)-film. They use a $N_2$/Ar-gas mixture of which the $N_2$-concentration is in the range of 14–38 vol %. The metallization scheme proposed by the Lorenzen et al. patent is not optimum with respect to contact resistance and high temperature stability because bottom layer of TiW has direct contact with the Si substrate.

SUMMARY OF THE INVENTION

The present invention provides a good ohmic contact and stability by forming a thin layer of PtSi in contacts. It is well known that PtSi and $PtSi_2$ reduce contact resistance. However, it was not known that the PtSi-layer could act as a stabilizer of a TiW based diffusion barrier. The stabilizing mechanism was either a thermodynamic or mechanical character like a stress buffer, and the exact mechanism is not established yet. It is also well known that TiW-film is quite stress sensitive and intrinsic stress is tensile. A direct contact between a TiW-film and bulk-Si (p+ and n+doped) was not stable at a high temperature (420° C.).

Figure 2:
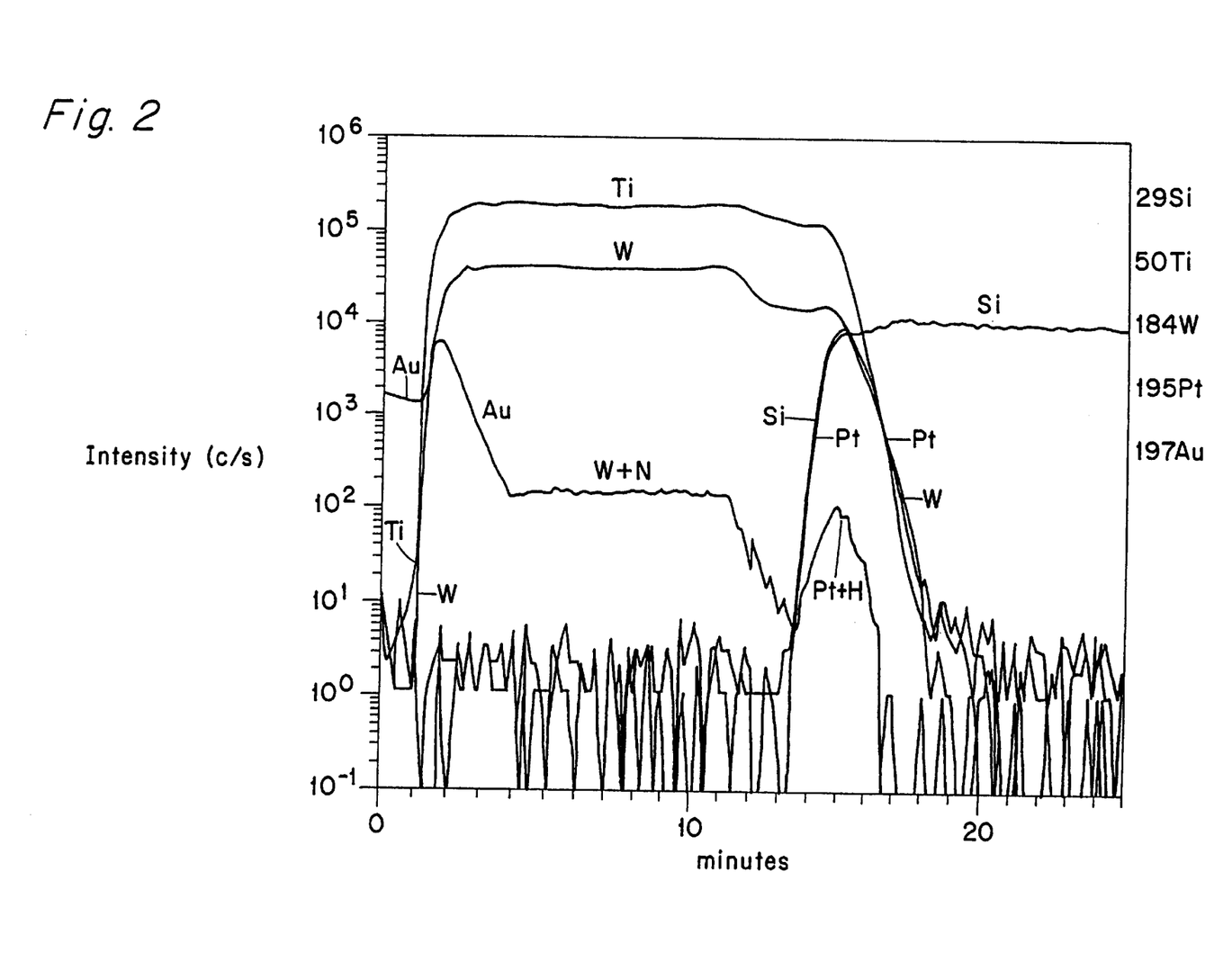
FIG. 2 shows a SIMS' analysis of the RF reactively sputtered Type I metallization scheme after annealing at 420° C. for 280 hours (in N$_2$). The multilayers are: PtSi(200 Å)/TiW(250 Å)/TiW(N)(1.8 kÅ)/Au(1 kÅ).
Figure 5:
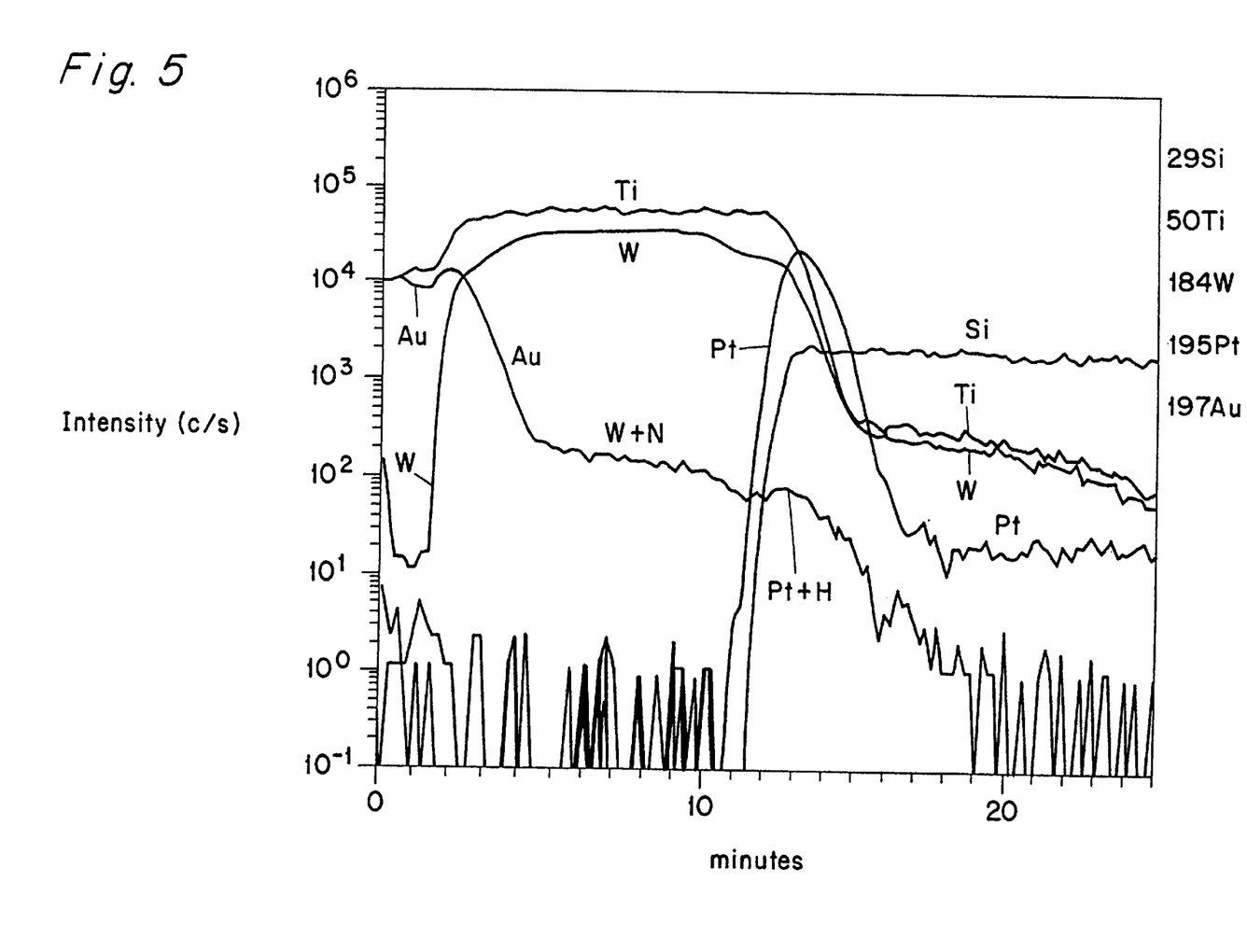
FIG. 5 shows a SIMS analysis of the RF reactively sputtered Type II metallization scheme after annealing at 420° C. for 90 hours (in N$_2$). The multilayers are: PtSi(200 Å)/TiW(250 Å)/TiW(N)(1 kÅ)/TiW(250 Å)/Au(1 kÅ).

The present invention provides a very stable diffusion barrier by using a nitrided TiW, TiW(N), obtained by an RF-reactive sputtering technique. A comparative study of the diffusion barriers sputtered by different techniques was performed by SIMS (secondary ions mass spectrometer) and SEM (scanning electron microscope). The stability of the TiW(N)-films obtained by DC-magnetron and RF-magnetron sputtering is much inferior to the RF-sputtered films (FIGS. 2 and 5).

Superiority of the RF-reactive sputtering has also improved adhesion strength and step coverage as well as reduced particle generation. Currently the DC-magnetron sputtering technique is exclusively used in IC-metallization because of a higher sputter rate.

The present invention provides good adhesion between SiO$_2$ and TiW layers and between the diffusion barrier and a Au-layer. The invention offers two kinds of interfaces which are dependent on contents of residual gases of H$_2$O and O$_2$ in a sputter chamber. For a high vacuum better than 10$^{-7}$ Torr, an interface of TiW(N)-Au (Type I) is preferable for extremely high reliability. However, for a moderate or rather poor vacuum condition, an interface of TiW-Au (Type II) is ii preferable. The latter improves slightly the adhesion property, but has a shorter lifetime due to formation of an intermetallic alloy between the Au- and Ti-metals.

The adhesion strength is dependent on oxygen and nitrogen contents in the TiW(N,O)-film. Au-peeling was mostly caused by a thin TiO$_2$-film at the interface which effectively prevented Au penetration through the oxide into the diffusion barrier. The Dening et al. article observed that the adhesion strength between TiW(N,O) and Au was weaker than the interface between TiW and Au. In their paper there is no explanation of the reason. However, the weaker adhesion might largely depend on a rather high oxygen content (~6%, by AES, Auger Electron spectroscopy) just at the interface and uncontrolled nitrogen content (which might be too high) in the TiW(N,O)-film due to a lift-off technique.

The adhesion strength between SiO$_2$ and bottom glue layer of TiW-film has an important influence on the etch undercut and the device reliability. Weak adhesion easily creates a small cavity (crevasse) in the contact hole due to temperature mismatching during alloying. As the result, surface diffusions of the Au-atoms into the Si-substrate and the Si-atoms into the Au-conductors will be greatly facilitated.

The present invention also offers corrosion resistant metallization schemes for the microdevice interconnections.

Thus, the present invention relates to semiconductor devices, especially to gold interconnections of silicon based devices. The invention relates to devices for high current and high temperature operations with good reliability and a long lifetime. The invention directly relates to two types of multilayer diffusion barriers between gold and silicon because of the gold-silicon eutectic at ~370° C.

This invention relates to multilayer diffusion barriers with low contact resistance to the silicon substrate and with good adhesion to insulating layers of SiO$_2$ (inclusively, doped glasses of PSG and BPSG) and Si$_3$N$_4$ and to the gold conductors.

This invention also relates to multilayer diffusion barriers which cause smaller undercut in a plasma etch.

This invention further relates to a reactive sputter technique which is suitable to obtain most essential properties of a diffusion barrier; for example long-term high temperature stability, good adhesion, less particulation, better step coverage in contact holes and wide process latitude even with a metal pitch of 1.5 µm, or smaller.

This invention additionally relates to an easily feasible and cost effective metallization process suitable for mass production of fine geometry gold conductors.

BRIEF DESCRIPTION OF DRAWINGS

The present invention will now be described by reference to the following drawings.

DETAILED DESCRIPTION OF THE INVENTION

Figure 6:
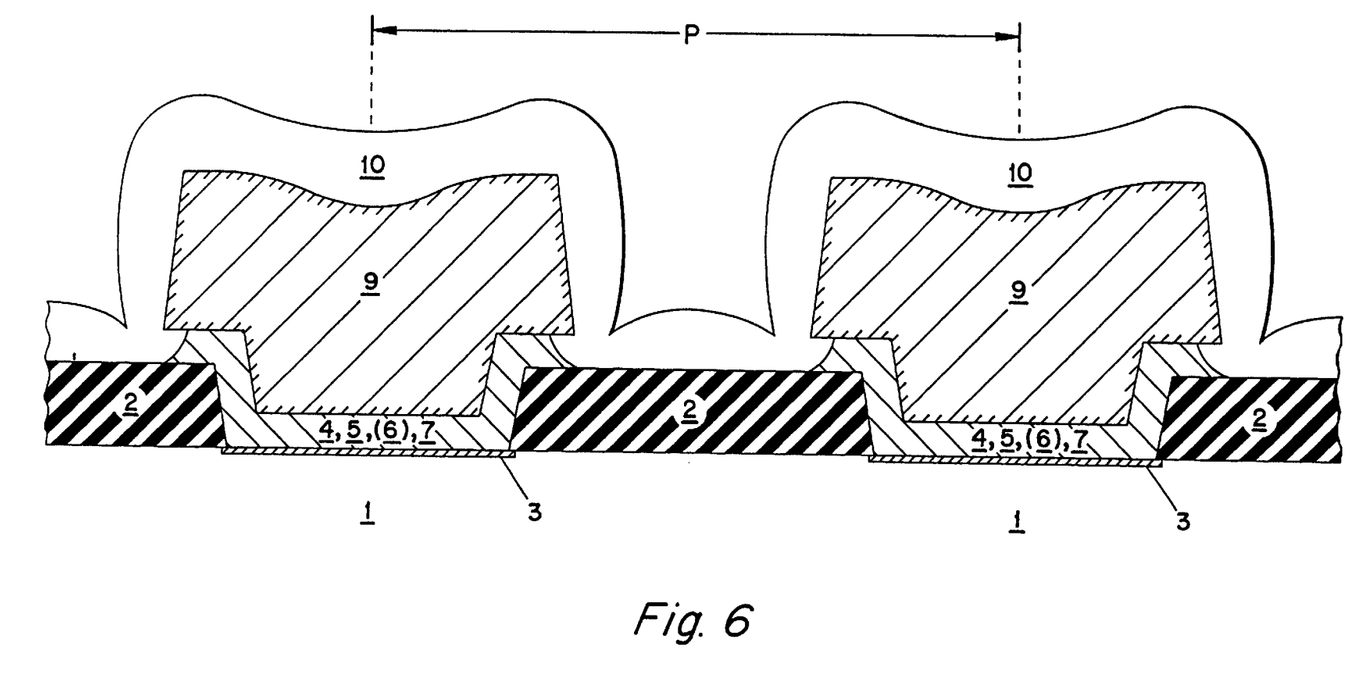
FIG. 6 illustrates a plurality of the microdevice interconnections in acccordance with the invention.

Two metallization schemes of PtSi/TiW/TiW(N)/Au (Type I) and PtSi/TiW/TiW(N)/TiW/Au (Type II) and associated process are described for microcircuit interconnections. The metallization schemes and process are capable of IC-interconnections with a metal-pitch P as small as 1.5 µm, or even smaller (see FIG. 6). The metallization schemes are reliable for continuous high temperature and high current operations.

In accordance with the present invention, the disadvantages of TiW/Au, TiW(N)/Au and TiW(N)/TiW/Au types of metallization schemes for microdevice interconnections are improved with respect to adhesion and high temperature long-term reliability as diffusion barriers. The present invention provides the possibility of reducing the whole metallization system to the range of 1 µm line width. The present invention has no or insignificant feasibility problems. At the same time, the present invention is one of the most cost effective metallization processes.

The present invention consists of two metallization schemes and an associated process:
Type I: PtSi(0.1–0.4 kÅ)/TiW(0.2–0.5 kÅ)/TiW(N)(1.0–2.0 kÅ)/Au(0.3–1.0 kÅ)/Au(7–15 kÅ, electroplated);
Type II: PtSi(0.1–0.4 kÅ)/TiW(0.2–0.5 kÅ)/TiW(N) (1.0–2.0 kÅ)/TiW(0.1–0.5 kÅ)/Au(0.3–1.0 kÅ)/Au(7–15 kÅ, electroplated).

By these dimensions, the Type I metallization scheme has a thickness ratio TiW/Au (adjacent) being zero. In the calculation the bottom layer of TiW film is excluded.

The Type I is considered better for a high vacuum (<10$^{-7}$ Torr) condition in a sputter chamber, while the Type II is better for a moderate or rather poor vacuum (>10$^{-7}$ Torr) system. For both cases the N$_2$-content in Ar is 5–10 vol % for the reactive sputtering of the TiW(N)-film. For the better ohmic contact and stability of the multilayers of adhesion and diffusion barrier, a thin layer (100–400 Å) of PtSi is formed in the contact holes. The invention includes a depositing a pure Pt-metal (approximately half of the PtSi thickness) by sputtering (preferably in the same sputter machine for the rest of the metals) or evaporating at an oxide-free surface of the Si-substrate. A thin (<20 Å) native SiO$_2$-film is sufficient to make the whole silicidation process uncertain with respect to the film thickness. The formation of the PtSi-layer is preferably performed in an inert atmosphere of N$_2$ by annealing at 600°–620° C. for 30 min. The surplus Pt-metal is preferably stripped away in a conventional manner with a mixture of HNO$_3$+3HCl solution.

Before the sputtering of the first glue layer of TiW-film, a mild sputter etch is preferably performed by an RF-sputter technique in order to eliminate some native $SiO_2$ as well as $H_2O$ at the surfaces of the PtSi and $SiO_2$-film, respectively. Without the sputter etch it is very difficult to eliminate water and monolayer of OH-groups which are hydrogen bonded to the $SiO_2$ surface. One of the major reasons for failure to adhere to the $SiO_2$ surface is the hydrogen bonded surface water and too high residual gas concentrations of $H_2O$ and $O_2$ in the sputter chamber.

A presputter with the TiW-target is preferably for some minutes (2–5) in order to clean the target surface and to getter the residual gases of $H_2O$ and $O_2$ in the sputter chamber.

Figure 3:
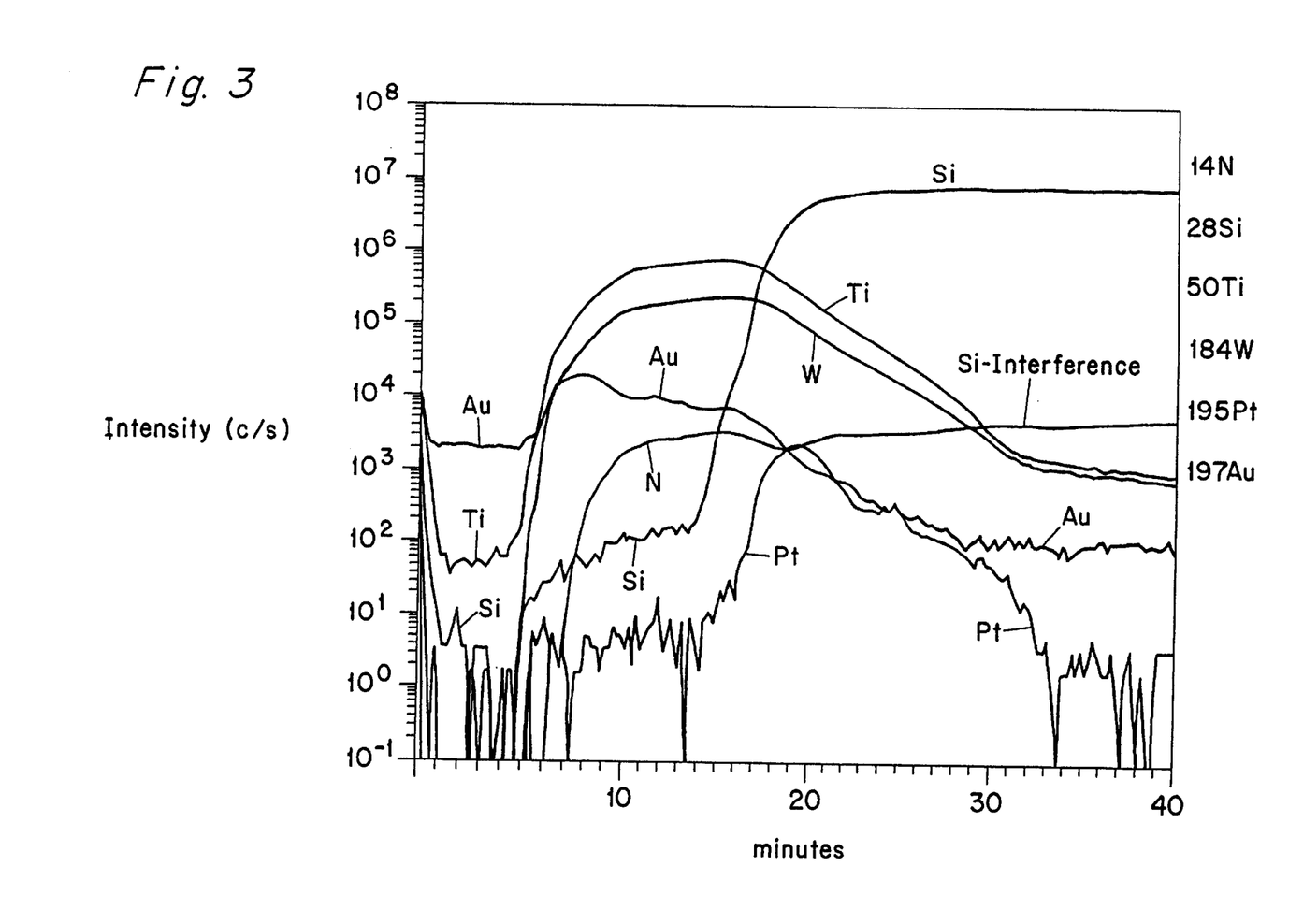
FIG. 3 shows a SIMS analysis of the DC-magnetron reactively sputtered diffusion barrier annealed at 420° C. for 30 min. (in N$_2$). The multilayers are: PtSi(200 Å)/TiW(N)(3 kÅ)/TiW(1 kÅ)/Au(10 kÅ).
Figure 4:
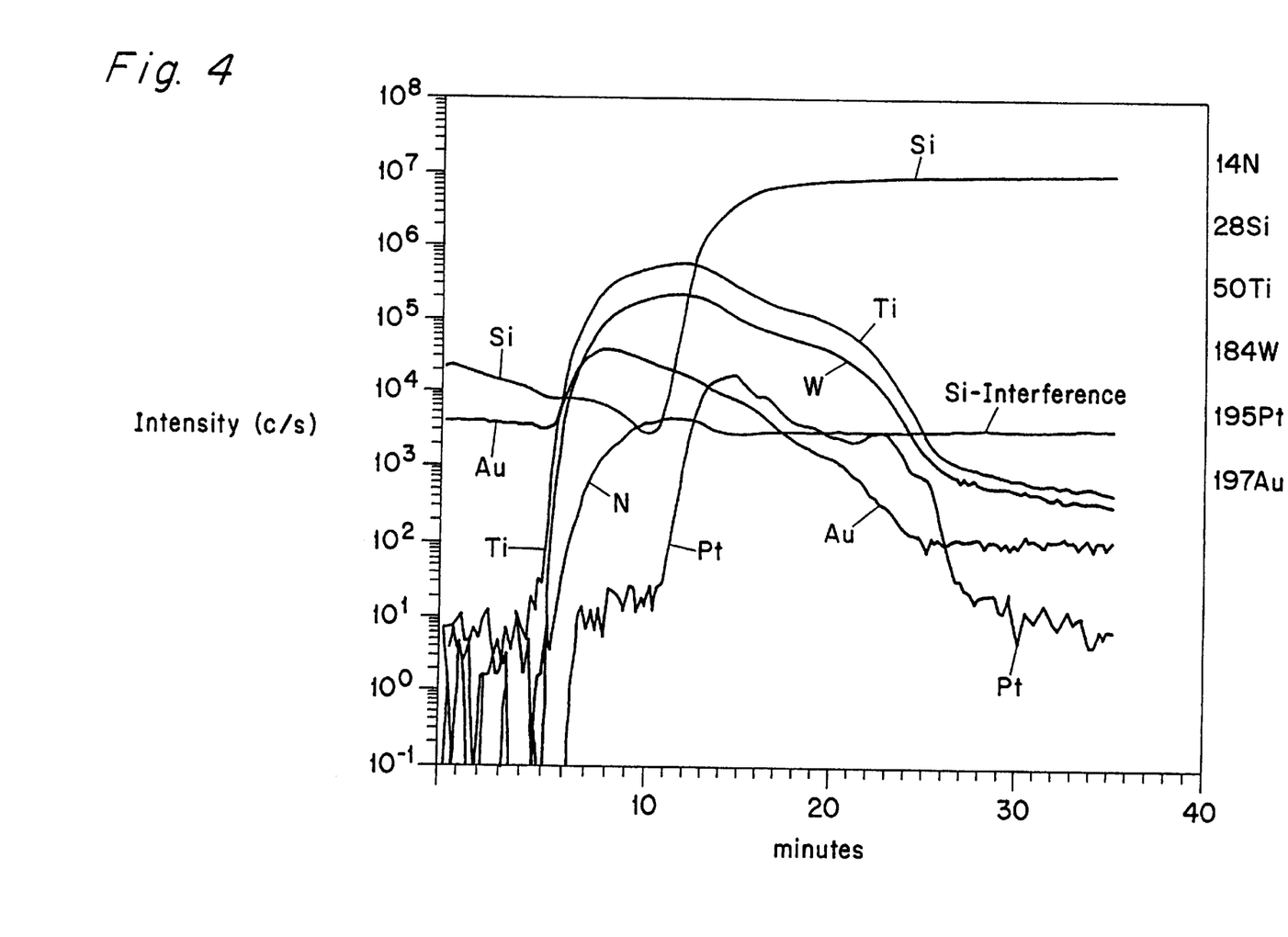
FIG. 4 shows a SIMS analysis of the RF-magnetron reactively sputtered Type II metallization scheme after annealing at 420° C. for 30 min. (in N$_2$). The multilayers are: PtSi(200 Å)/TiW(250 Å)/TiW(N)(1.8 kÅ)/TiW(120 Å)/Au (12 kÅ).

A thin layer (200–500 Å) of TiW-film is sputtered and used as a glue layer. The purity and thickness of the TiW-film is important. A high content of oxygen and nitrogen in the film causes a weak adhesion to the $SiO_2$-film. A too thick TiW-film is not preferable because there is a tendency to form some silicides by talking the Si-atoms from the PtSi-layer (FIGS. 3–5). Without the PtSi-layer the stability of the TiW-film was quite poor. Rather fast diffusion of the Ti- and W-atoms into the Si-substrate was observed.

A reactively sputtered TiW(N)-film (1.0–2.0 kÅ) is obtained by an RF-sputtering technique with a gas mixture of $N_2$ and Ar. The mixing ratio ($N_2$-concentration in Ar=5–10 vol %) is dependent on an RF-power density (W/cm$^2$), pressure (10–15 mTorr), $N_2$-gas flow rate and wafer temperature which determine the chemical reaction rate of nitrogen with the Ti-and W-atoms.

A high RF-power density (>1.5 W/cm$^2$) is preferable in order to obtain a relatively oxygen free film of TiW(N) which is needed to get good adhesion with the Au-layer in the Type I structure. This RF-reactively sputtered film of TiW(N) functions as a real diffusion barrier. The control of the nitrogen and oxygen (unintentionally included from the residual gases) contents in the film is very important for balancing the properties of diffusion barrier, adhesion, sheet resistance and stress. The higher concentrations of nitrogen and oxygen in the TiW(N)-film are, the better diffusion barriers will be. However, such films have too weak adhesion to the Au-layer and have too high resistivity. The resistivity of the TiW(N)-film is typically more than three times of a rather pure TiW-film. As mentioned herein elsewhere, the effect of adhesion loss is dramatically due to the oxide formation of $TiO_2$ at the surface of the TiW(N)-film.

The choice of an adequate sputter technique has also an important effect on the quality of the TiW(N) film. The present invention reveals some essential differences of the TiW(N) films obtained by an RF- and magnetron associated (DC-magnetron and RF-magnetron) sputter techniques. The superiority of the RF-sputtered TiN(N)-film annealed at 420° C. for 280 hours (in $N_2$ is demonstrated in a SIMS analysis (FIG. 2). The SIMS analysis also indicates a good adhesion between Au and TiW(N)-layers. The SIMS analyses of the DC-magnetron sputtered and RF-magnetron sputtered diffusion barriers annealed at 420° C. for 30 min (in $N_2$) are shown in FIGS. 3 and 4, respectively.

Both DC-magnetron and RF-magnetron sputtering techniques produce quite unstable diffusion barriers. These magnetron associated reactive sputtering techniques cause uneven chemical reactions of nitrogen against the wafers and TiW-target (cathode) because the magnetrons generate a very intense plasma just underneath the magnetrons. The serious consequence is uneven nitridation of the TiW(N)-film at the wafers. This intense and uneven nitridation of the target causes mostly Tin and $WN_x$ particles. Apparently nobody has hitherto clearly pointed out these kinds of negative effects of the magnetron associated reactive sputtering of the TiW(N)-film. However, a well known negative effect of less step coverage due to formation of cavities in the target underneath the magnetrons can be improved by a latest technique of rotating or scanning magnetrons. However, the uneven nitridation can not completely be avoided even by the advanced techniques.

The present invention reveals the importance of a proper thickness of a pure TiW-layer under the Au-layer in the Type II metallization scheme in case this glue layer is necessary. The instability of a relatively pure TiW-film as a diffusion barrier between Si and Au has been reported (in the Nowicki et al. article). A new breakdown mechanism was explained by the role of Au-Ti intermetallic alloy. The glue layer of TiW loses stability at a high temperature (~400° C.) and starts to form the Au-Ti intermetallic alloy after the Ti-metal's upwards diffusion into the Au-layer (FIGS. 3 and 5). The amount of the Au-Ti intermetallic alloy decides the level of tensile stress on the diffusion barrier at high temperatures. The tensile stress on the diffusion barrier facilitates the Au-diffusion into the bulk-Si and Si-diffusion into the Au-layer.

This is one of the major breakdown mechanisms of the Type II barrier. Therefore it is important to choose a thin layer of TiW (e.g., 100–500 Å). After the deposition of the TiW(N)-film, it is important to eliminate nitrogen sources both from the sputter chamber and the TiW-target (cathode) surface by performing, e.g., a careful purge in the chamber and a presputter for some (2–5) minutes with the TiW-target before sputtering of the glue TiW-layer in the Type II scheme because the target surface is nitrided during sputtering of the TiW(N)-film.

After depositions of the TiW(N) for the Type I or the last glue layer of TiW-film for the Type II, a thin layer (0.3–1.0 kÅ) of Au is sputtered in situ (without breaking the vacuum) at a high sputter rate in order to obtain a pure Au-film and to enhance adhesion to the underlying layer. Before sputtering of the thin Au-layer it is preferable to perform a short (0.5–1 min) presputter with the Au-target. The thin Au-layer works as a protection film against oxidation and chemical attack to the TiW- and TiW(N)-films. It also works as a conducting and initiating film for even electroplating of the Au-conductors (7–15 kÅ).

As previously discussed about the breakdown mechanism of the diffusion barriers, the Type I (FIGS. 1b and 2) metallization scheme, which has no tendency to form any Au-Ti intermetallic alloy, is more stable than the Type II (FIG. 1c). FIG. 5 shows a SIMS analysis of the Type II diffusion barrier after annealing at 420° C. for 90 hours (in $N_2$) Upward diffusion of the Ti-metal and downward diffusion of the Ti-, W- and Pt-metals into the bulk-Si are clear.

The PtSi-layer is dissolved after competing with the Ti- and W-atoms for Si-atoms. The mechanism of the Ti-, W- and Pt-atoms' movements into the bulk-Si looks like a formation of silicides. However, even the Type II barrier easily fulfills requirements of high temperature and high current operations. The HF power transistors could withstand thermal loading for 40 hours at 420° C. without any loss of yield. The result corresponds to a lifetime of mom than 200 years with an operating temperature of 130° C. and Ea=0.9 eV (Ea=activation energy in the Arrhenius equation, $A^*\exp(-Ea/kT)$, where A and k (Boltzmann) are constants and T=absolute temperature).

Figure 1A:
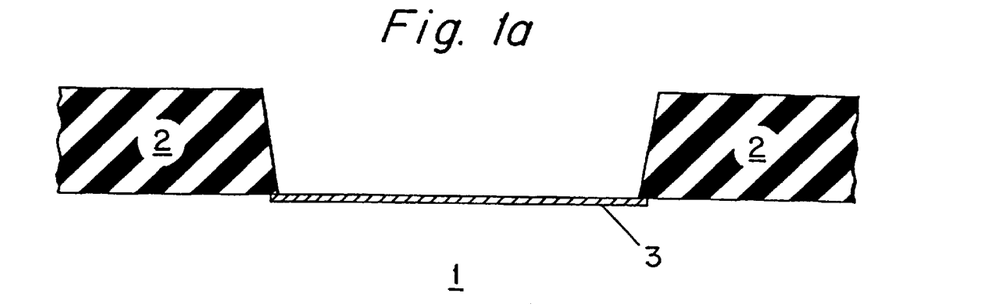
FIGS. 1a–1g illustrate the fabrication sequences of the microdevice interconnections.
Figure 1B:
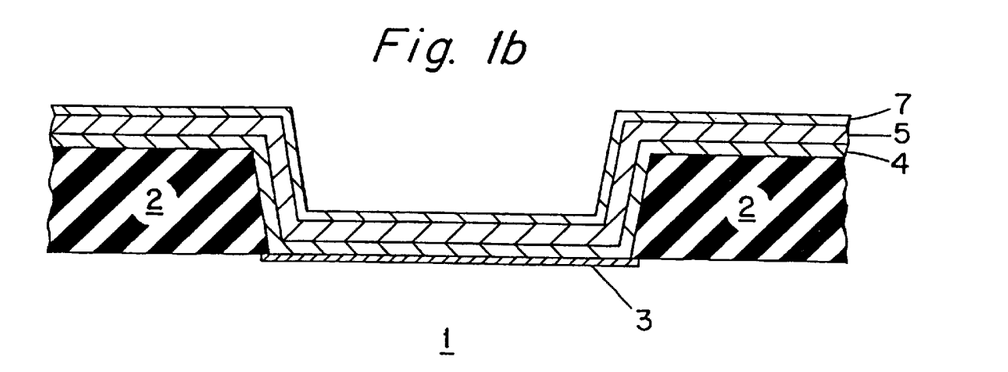
Figure 1C:
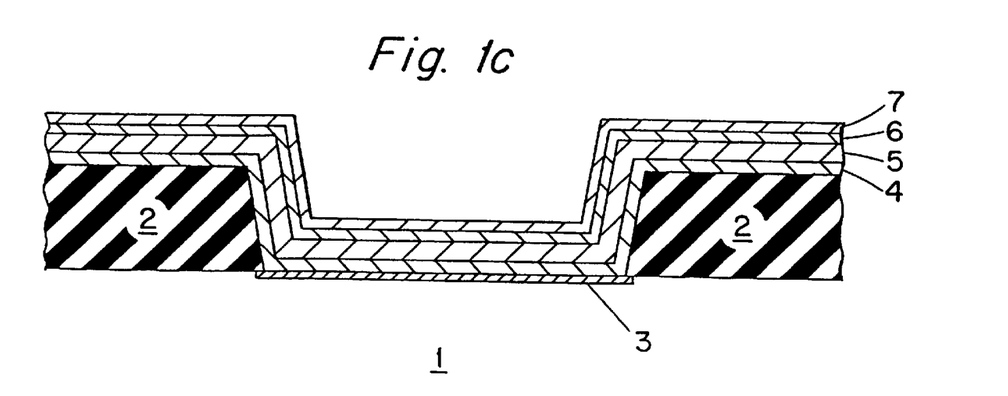

Referring to FIGS. 1a–1g, a method embodying the present invention is illustrated. FIG. 1a illustrates a Si-substrate 1 which normally is covered with an insulating layer of $SiO_2$ or layers of $Si_3N_4/SiO_2$ or $SiO_2/Si_3N_4/SiO_2$ films 2. The insulator film 2 is opened by a plasma or wet or a combination of wet/dry (plasma) etch in order to form contact holes. Slightly sloped contact holes may be preferable for a better step coverage of the diffusion barrier (see below). Some dopants (n- and p-types) may be implanted or deposited and driven at high temperatures (~1000° C.) into the Si-substrate 1 through the contact holes. A thin Pt-film (100–200 Å) may be sputtered or evaporated after deoxidation of a thin $SiO_2$-film formed in the contact holes. The deoxidation is performed by immersing the Si-substrates 1 in a diluted (1–2%) HF-water solution.

A PtSi-layer 3 is formed by annealing at 600–620° C. for 30 min. in an inert atmosphere of $N_2$. An eventual excess Pt-metal is stripped away in a regal solution ($HNO_3$+3HCl).

FIG. 1b and FIG. 1c illustrate the present invention of the Type I and Type II metallization schemes, respectively. A thin layer of a TiW-film (200–500 Å) 4 is sputtered after a careful pump-down and a mild sputter etch with an RF-sputtering mode. This TiW-layer 4 works as a glue layer to the insulating film(s) 2.

The adhesion strength is dependent of the purity of the TiW-layer 4 which is in turn determined by the residual gas level of $H_2O$ and $O_2$ in the sputter chamber, sputtering rate and hydrogen bonded water to the surface of $SiO_2$ 2. A vacuum level better than $10^{-7}$ Torr and a high sputtering rate are preferable in order to minimize an oxygen content in the TiW-film 4. However, without the mild sputter etch it is difficult to obtain an optimum adhesion because a monolayer of $H_2O$ is chemically (hydrogen-bond) bonded to the $SiO_2$ surface 2.

The mild sputter etch also enhances the adhesion by physically roughening the surfaces 2 and 3. It is also very important to take a precaution not to damage the PtSi-layer 3 too much. A thickness loss of ~50 Å seems to be acceptable for most cases. In addition to the above measures, a presputter of the TiW-target (cathode) for 2–5 minutes is preferable in order to getter the residual gases of $H_2O$ and $O_2$ in the chamber and to clean the target. Strong adhesion between the insulating film(s) 2 and the TiW glue layer 4 has an essential meaning in order to minimize an etch undercut and to prevent surface diffusion of Au 9 into the silicon substrate 1 because the stress caused by temperature mismatch can form a cavity between the contact hole and the TiW-layer 4.

The real diffusion barrier of the TiW(N)-film (1.0–2.0 kÅ) 5 is sequentially sputtered by an RF-reactive sputtering technique. An RF-power density more than 1.5 W/cm$^2$ and a $N_2$ concentration of 5–10 vol % in the Ar-gas flow are preferable. A gas pressure of 10 mTorr is a compromise for step coverage, stress and sputter rate. The step coverage is dependent of the contact hole's aspect ratio, side angle of contact holes, sputter parameters (especially pressure) and the sputtering technique.

There is a clear tendency that a TiW(N)-film produces less step coverage and generates more particles than a TiW-film. However, these negative effects of the phenomena are very small with an RF-reactive sputtering technique compared with a magnetron associated reactive sputtering technique (DC and RF). Most of all, the stability of the RF-reactively sputtered film is much superior to a film obtained by a magnetron associated reactive sputtering.

A thin film (300–1000 Å) of Au 7 (FIG. 1b) is sequentially sputtered after purging the $N_2$-gas and a short (0.5–1 min) presputter of the Au-target. It is important to perform the Au-sputtering without breaking vacuum after the TiW(N)-film. Otherwise it causes adhesion loss or Au-peeling due to $TiO_2$-formation at the surface of the TiW(N)-film. It is preferable to use a high RF-power density in order to obtain better adhesion even though the film thickness is small.

Referring to the Type II metallization scheme (FIG. 1b), a thin glue layer (100–500 Å) of TiW 6 is sputtered after a careful purging of the $N_2$-gas in the chamber and a presputter of the TiW-target for 2–5 minutes because the target surface is nitrided during sputtering of the TiW(N)-film. Sputtering of the Au-film 7 is identical with the Type I.

Figure 1D:
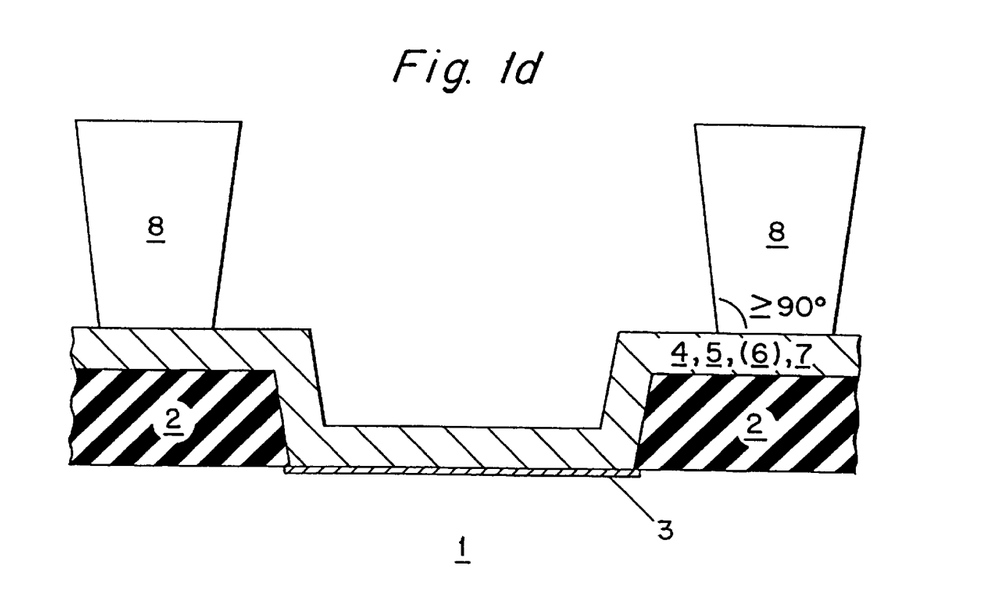

FIG. 1d illustrates a (reentrant) photoresist pattern 8 over the Au-film 7. The photoresist pattern for Au-electroplating can be obtained by a conventional optical lithography process. It is preferable to create a reentrant (angle >90°) or vertical photoresist profile 8 in order to get a better step coverage of a final passivation film 10 over the plated Au 9. For a very small dimension of a metal-pitch (1.5–4 μm), a combination of an image reversal photoresist (AZ5218E or AZ5214E, Hoechst) and an i-line (wavelength=365 nm) or g-line (436 nm) wafer stepper exposure can easily create a half micron resist patterns with a sufficiently thick resist (>1.5 μm) with the reentrant profile.

Even a standard positive photoresist, which can generate a vertical resist profile, works very well for most cases. After a hard baking (~115° C./30 min. with a sufficient air or $N_2$-flow) of the resist patterns an $O_2$-plasma descum should be applied in order to clean the Au-surface 7. This plasma descum is important because a dirty Au-surface will not start to be plated.

Figure 1E:
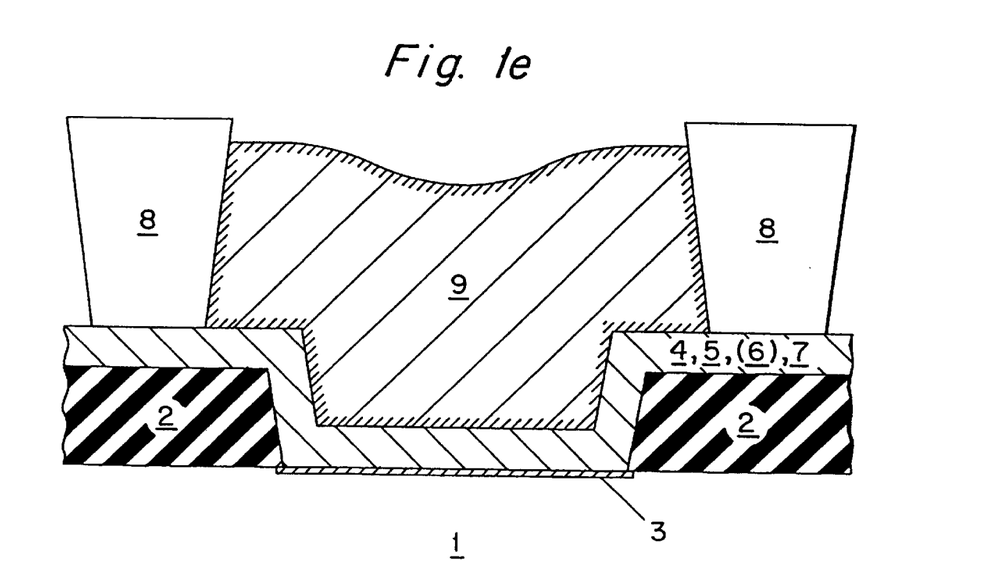

FIG. 1e illustrates electroplated Au 9 with photoresist patterns 8. The Au plating bath is not based on an AuCN complex which causes resist loss etc., but on a $NaAuSO_3$ complex. The latter plating bath with a proper pH-value (7.2–9.5) is quite gentle against the photoresist patterns. The bath also contains a leveller of which planarization effect is shown in the Au-profile 9. An Au-thickness of 0.7–1.5 μm is sufficient for the most IC-applications. However, the Au-thickness can be easily increased to the range of Au-bumps (~25 μm) for TAB (tape automated bonding) applications with a thicker resist After plating the Au-conductor 9 the photoresist 8 is stripped in acetone, and the wafers are rinsed in propanol and DI-water (deionized) in sequence. After the photoresist stripping an $O_2$-plasma descum should be performed again in order to obtain a clean Au-surface before a wet etch of the thin Au-film 7.

Figure 1F:
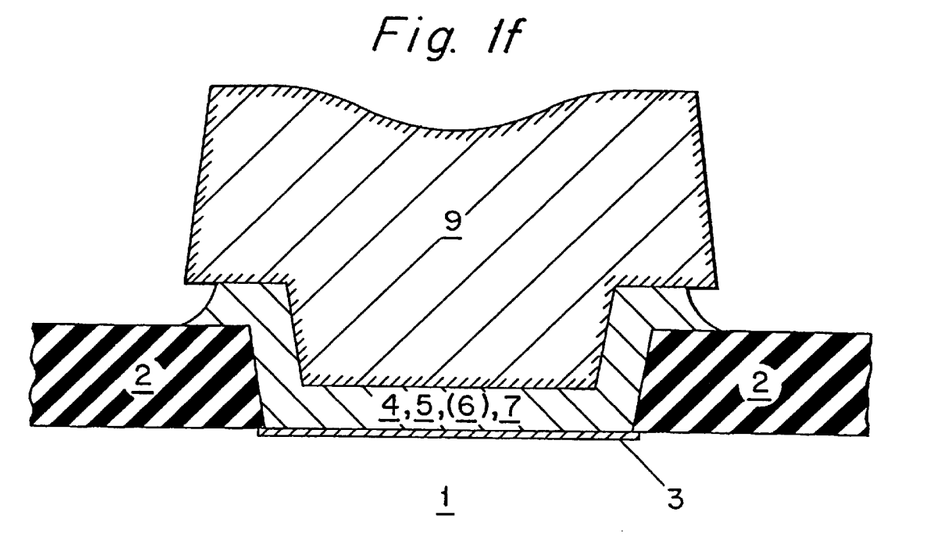

FIG. 1f illustrates the profiles of the plated Au-conductor 9 and the wet etched thin film of Au 7 and the plasma etched glue layer of TiW 6 (only for the Type II) and the diffusion barrier layer of TiW(N) 5 and bottom glue layer of TiW 4. The plasma etch of the layers 6, 5 and 4 can be performed by using $SF_6$-gas in a plasma mode (RF-anode coupling) or RIE (reactive ion etch, RF-cathode coupling) mode dry etcher. It is preferable to apply an RIE mode dry etcher in order to minimize the etch undercuts. It is not advisable to apply a wet etch for the layers 6, 5 and 4 by a $H_2O_2$-solution. The wet etch causes the undercuts and is too slow against the TiW(N)-layer 5.

After the etch of the layers 7, (6), 5 and 4, an annealing is performed at 420° C. for 30 min. in a $N_2$-atmosphere in order to get better ohmic contact and to enhance some intermixing of the metals for better adhesion.

Figure 1G:
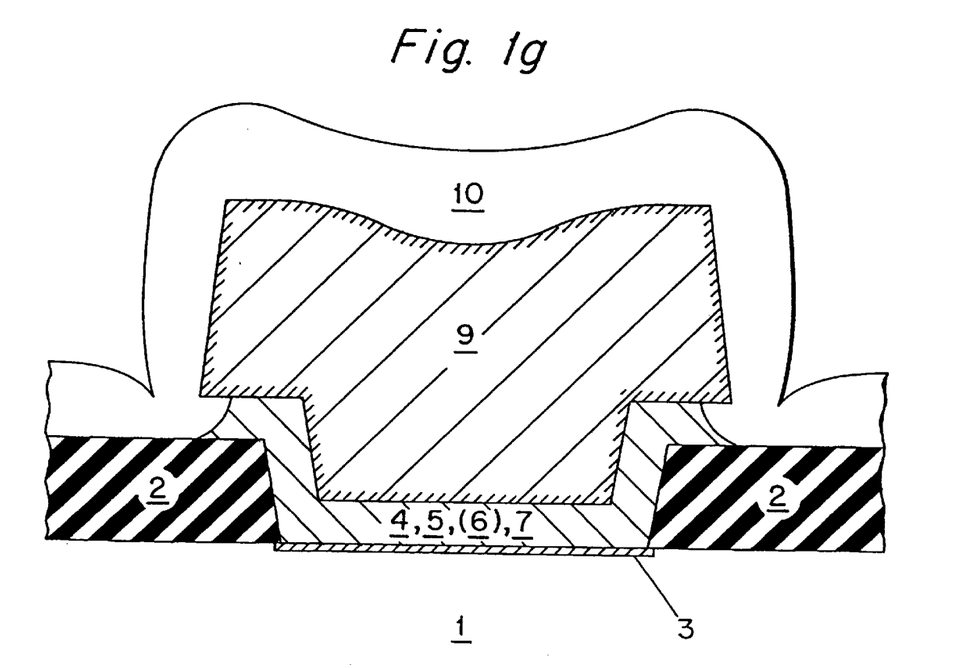

FIG. 1g illustrates the final profiles of the Au-conductor 9 and a PESiN$_X$ (plasma enhanced silicon nitride, 4–8 kÅ) passivation film 10. The passivation film 10 protects the Au-conductor 9 against both mechanical and chemical (corrosion) damages. This interconnection scheme is practically corrosion free without a passivation film because annealing in the $N_2$-atmosphere and an air exposure form thin protection films of TiN and TiO$_2$ at all exposed surfaces of the TiW and TiW(N)-films 6, 5 and 4. The choice of the PESiN$_X$-film also depends on its better thermal conductivity than SiO$_2$. For high power transistors, effective heat spreading is a very important property for reliability.

The bondpad's opening in the PESiN$_X$-film 10 is performed by a conventional plasma etch by an etch gas of NF$_3$ or a mixture of CF$_4$+O$_2$(~10 vol %) after a noncritical lithography step. After the bondpad's opening the photoresist is stripped in acetone or some other solvents.

FIG. 2 shows a SIMS analysis of the RF-reactively sputtered diffusion barrier after annealing at 420° C. for 280 hours in N$_2$. The multilayers of a Type I metallization scheme are:

PtSi(200 Å)/TiW(220 Å)/TiW(N)(1.8 kÅ)/Au(1 kÅ).

The diffusion barrier is still very stable after a severe thermal stress test, and adhesion between Au- and TiW(N)-layers is good because Au-downwards diffusion into the TiW(N)-layer is clearly seen. The ohmic contact between the TiW- and PtSi-layers is also good. The PtSi-layer is also intact because the upper-signal positions of the Si- and Pt-ions are clearly superimposed. The N$_2$-content in Ar-gas is 10 vol % for the TiW(N)-film sputtering.

FIG. 3 shows a SIMS analysis of the DC magnetron reactively sputtered diffusion barrier annealed at 420° C. for 30 min. in N$_2$. The multilayers of the metallization scheme are:

PtSi(200 Å)/TiW(N)(3 kÅ)/TiW(1 kÅ)/Au(10 kÅ).

The diffusion barrier is relatively very unstable. Upward diffusion of the Ti- and Si-atoms into the Au-layer as well as downward diffusion of the Ti-, W-, Au- and Pt-atoms into the bulk-Si are very clear.

Dissociation of the PtSi-layer is also clear. The N$_2$-content in Ar gas is 30 vol %. The instability of the diffusion barrier is an improper reactive sputter technique for the TiW(N)-film and too thick glue layer (1 kÅ) which causes the formation of an Au-Ti intermetallic alloy.

FIG. 4 shows a SIMS analysis of the RF-magnetron reactively sputtered diffusion barrier annealed at 420° C. for 30 min. in N$_2$. The multilayers of the metallization scheme are:

PtSi(200 Å)/TiW(250 Å)/TiW(N)(1.8 kÅ)/TiW(120 Å)/Au(12 kÅ).

The diffusion barrier is relatively unstable. Upward diffusion of the Si-atoms into the Au-layer as well as downward diffusion of the Ti-, W-, Au- and Pt-atoms into the bulk-Si is very clear. However, the upwards diffusion of the Ti-atoms observed in FIG. 3 is not visible in this case. Dissociation of the PtSi-layer is very clear. The N$_2$-content in Ar gas is 10 vol %. The stability of the diffusion barrier is slightly better than the case of FIG. 3. The instability is caused by an improper reactive sputter technique for the TiW(N)-film even though a Type II configuration is used.

FIG. 5 shows a SIMS analysis of the RF-reactively sputtered diffusion barrier annealed at 420° C. for 90 hours in N$_2$. The multilayers of a Type II metallization scheme are:

PtSi(200 Å)/TiW(250 Å)/TiW(N)(1 kÅ)/TiW(250 Å)/Au(1 kÅ).

The diffusion barrier becomes instable after a severe thermal stress test. Upwards diffusion of the Ti- and W-atoms as well as downwards-diffusion of the Ti-, W- and Pt-atoms are clear. Decomposition of the PtSi-layer has started, but is not severe. Formation of an Au-Ti intermetallic alloy is visible in the microscope (SEM). However, the diffusion barrier is quite stable for a thermal stress up to 40 hours at 420° C. without any yield loss of HF power transistors even though thickness of the TiW(N)-film is only 1 kÅ.

As demonstrated above, an adequate choice of a film configuration, thickness and sputter technique verified long-term reliability, good adhesion to SiO$_2$, Si$_3$N$_4$ and gold layers and low contact resistance to both p+(boron) and n+(phosphorous, arsenic or antimony) doped silicon substrate. For the sequential depositions of the TiW-and TiW(N)-films an application of an RF-sputtering technique instead of mostly used DC-magnetron played an essential role with respect to the long-term reliability, good adhesion, good step coverage of contact holes and less particulation.

The stability of the RF-reactively sputtered TiW(N) film as a diffusion barrier is much superior to the barriers obtained by magnetron associated reactive sputtering (DC-magnetron and RF-magnetron). The superiority is demonstrated by SIMS (secondary ions mass spectrometer), SEM (scanning electron microscope) analyses and the lifetime of HF power transistors.

The metallization schemes of the Type I and II are superior to some known schemes of Si/TiW(N)/TiW/Au, Si/TiW/TiW(N)/TiW/Au or Si/TiW/TiW(N)/Au with respect to long-term reliability and contact resistance. However, the Type I is preferable when a good vacuum (<10$^{-7}$ Torr) is obtainable in the sputter chamber. The Type I is superior to the Type II with respect to the long-term high temperature stability, process simplicity and process latitude by less etch undercut.

However, the Type II avoids Au-peeling when the contents of residual gases of H$_2$O and O$_2$ in the sputter chamber is rather high due to a poor pumping system. The thin TiW layer between the TiW(N) and Au layers in the Type II enhances the adhesion by Au-interdiffusion. However, the pure TiW-film underneath the thick Au-layer causes the formation of an Au-Ti intermetallic alloy which initiates the breakdowns of the Type II.

The Type I and Type II withstand at least a thermal stress of 420° C./280 hours and 420° C./40 hours, respectively, without any loss of yield of HF power transistors. Even the shortest lifetime of the Type II corresponds to more than 200 years operation with a device temperature at 130° C.

The feasibility and cost efficiency of the metallization process are excellent by applying well established techniques of sputtering, gold electroplating and plasma etching.

It will be appreciated by those skilled in the art that the specific embodiments described herein are merely for purposes of explanation, and that many variations may be used without departing from the spirit and scope of the invention. Accordingly, it is intended that variations as will occur to those skilled in the art based upon the disclosures herein be included in the scope of the claims which follow.

I claim:

1. An interconnection on a semiconductor device, said interconnection comprising:

an insulating layer on a silicon substrate;

a contact hole in said insulating layer to expose a portion of said substrate;

a PtSi layer in said contact hole directly in contact with said substrate;

a TiW layer in said contact hole directly in contact with said PtSi layer;

a TiW(N) layer in said contact hole directly in contact with said TiW layer; and an Au layer in said contact hole directly in contact with said TiW(N) layer;

wherein the interconnections have a metal pitch of 1.5 μm or less.

2. An interconnection in accordance with claim 1, wherein said PtSi layer reduces contact resistance and stabilizes an interface between said substrate and said TiW layer, which acts as a glue layer.

3. An interconnection in accordance with claim 1, wherein said TiW layer is a pure TiW-film.

4. An interconnection in accordance with claim 1, further comprising a second Au layer on said Au layer.

5. An interconnection in accordance with claim 4, wherein said second Au layer is physically different from said first Au layer.

6. An interconnection in accordance with claim 4, wherein said Au layer is sputter deposited and said second Au layer is electroplated.

7. An interconnection in accordance with claim 6, further comprising:
   a $PESiN_X$ passivation film on said plated layer of Au.

8. An interconnection in accordance with claim 6, wherein thickness ranges are:
   PtSi(0.1–0.4 kÅ)/TiW(0.2–0.5 kÅ)/TiW(N)(1.0–2.0 kÅ)/ Au(0.3–1.0 kÅ)/Au(7–15 kÅ, plated).

9. An interconnection in accordance with claim 1, wherein thickness ranges are:
   PtSi(0.1–0.4 kÅ)/TiW(0.2–0.5 kÅ)/TiW(N)(1.0–2.0 kÅ)/ Au(0.3–1.0 kÅ).

10. An interconnection in accordance with claim 1, wherein said TiW(N) layer is deposited by a non-magnetron RF reactive sputtering process.

11. An interconnection in accordance with claim 1, further comprising a TiN layer formed in respective sidewalls of said TiW layer and said TiW(N) layer.

12. An interconnection on a semiconductor device, said interconnection comprising:
   an insulating layer on a silicon substrate;
   a contact hole in said insulating layer to expose a portion of said substrate;
   a PtSi layer in said contact hole directly in contact with said substrate;
   a TiW layer in said contact hole directly in contact with said PtSi layer;
   a TiW(N) layer in said contact hole directly in contact with said TiW layer; and
   an Au layer in said contact hole on said TiW(N) layer.

13. An interconnection in accordance with claim 12, wherein said TiW(N) layer is deposited by a non-magnetron RF reactive sputtering process.

14. An interconnection in accordance with claim 12, further comprising a second Au layer on said Au layer.

15. An interconnection in accordance with claim 14, wherein said second Au layer is physically different from said first Au layer.

16. An interconnection in accordance with claim 15, wherein said Au layer is sputter deposited and said second Au layer is electroplated.

17. An interconnection in accordance with claim 16, further comprising:
   a $PESiN_X$ passivation film on said plated layer of Au.

18. An interconnection in accordance with claim 16, wherein thickness ranges are:
   PtSi(0.1–0.4 kÅ)/TiW(0.2–0.5 kÅ)/TiW(N)(1.0–2.0 kÅ)/ Au(0.3–1.0 kÅ)/Au(7–15 kÅ, plated).

19. An interconnection in accordance with claim 12, wherein thickness ranges are:
   PtSi(0.1–0.4 kÅ)/TiW(0.2–0.5 kÅ)/TiW(N)(1.0–2.0 kÅ)/ Au(0.3–1.0 kÅ).

20. An interconnection on a semiconductor device, said interconnection comprising:
   an insulating layer on a silicon substrate;
   a contact hole in said insulating layer to expose a portion of said substrate;
   a PtSi layer in said contact hole directly in contact with said substrate;
   a TiW layer in said contact hole directly in contact with said PtSi layer;
   a TiW(N) layer in said contact hole directly in contact with said TiW layer;
   a first Au layer in said contact hole directly in contact with said TiW(N) layer; and
   a second Au layer directly in contact with said first Au layer, wherein said second Au layer is physically different from said first Au layer.

21. An interconnection in accordance with claim 20, wherein said TiW(N) layer is deposited by a non-magnetron RF reactive sputtering process.

22. An interconnection in accordance with claim 20, wherein said Au layer is sputter deposited and said second Au layer is electroplated.

23. An interconnection in accordance with claim 22, further comprising:
   a $PESiN_X$ passivation film on said plated layer of Au.

24. An interconnection in accordance with claim 22, wherein thickness ranges are:
   PtSi(0.1–0.4 kÅ)/TiW(0.2–0.5 kÅ)/TiW(N)(1.0–2.0 kÅ)/ Au(0.3–1.0 kÅ)/Au(7–15 kÅ, plated).

* * * * *